US012690467B2

(12) United States Patent
Yang

(10) Patent No.: US 12,690,467 B2
(45) Date of Patent: Jul. 21, 2026

(54) SEMICONDUCTOR PACKAGING METHOD

(71) Applicant: CR Runan Technologies (Chongqing) Co. Ltd., Chongqing (CN)

(72) Inventor: Weiyuan Yang, Chongqing (CN)

(73) Assignee: CR Runan Technologies (Chongqing) Co. Ltd., Chongqing (CN)

( * ) Notice: Subject to any disclaimer, the term of this patent is extended or adjusted under 35 U.S.C. 154(b) by 496 days.

(21) Appl. No.: 18/261,802

(22) PCT Filed: Jun. 7, 2022

(86) PCT No.: PCT/CN2022/097360
§ 371 (c)(1),
(2) Date: Jul. 17, 2023

(87) PCT Pub. No.: WO2022/262616
PCT Pub. Date: Dec. 22, 2022

(65) Prior Publication Data
US 2024/0087912 A1      Mar. 14, 2024

(30) Foreign Application Priority Data
Jun. 15, 2021    (CN) ......................... 202110661583.2

(51) Int. Cl.
*H10W 70/04* (2026.01)
*H10W 74/01* (2026.01)
*H10W 74/15* (2026.01)

(52) U.S. Cl.
CPC ....... *H10W 70/041* (2026.01); *H10W 70/042* (2026.01); *H10W 74/012* (2026.01); *H10W 74/019* (2026.01); *H10W 74/15* (2026.01)

(58) Field of Classification Search
CPC ............. H01L 21/4825; H01L 21/4828; H01L 21/563; H01L 21/568; H10W 70/041;
(Continued)

(56) References Cited

U.S. PATENT DOCUMENTS 8,436,481 B2    5/2013    Hoshino et al.
9,947,554 B2    4/2018    Choi et al.
(Continued)

FOREIGN PATENT DOCUMENTS

CN        101770188 A      7/2010
CN        102134453 A      7/2011
(Continued)

OTHER PUBLICATIONS

State Intellectual Property Office of the People's Republic of China, Office Action and Search Report Issued in Application No. 202110661583.2, Jul. 28, 2023, 13 pages. (Submitted with Machine Translation).
(Continued)

*Primary Examiner* — Jacob Y Choi
*Assistant Examiner* — Neil R Prasad
(74) *Attorney, Agent, or Firm* — McCoy Russell LLP

(57) ABSTRACT

A semiconductor packaging method is provided. The method includes: providing a carrier, where the carrier includes an attachment region for attaching a chip; forming a bonding layer, where an orthographic projection of the bonding layer on the carrier at least covers the attachment region, and the bonding layer is in a form of a film layer and uncured; attaching the chip onto the bonding layer, where the chip includes a first surface and a second surface opposite to the first surface, the first surface faces toward the bonding layer and a pad is disposed on one of the first surface and the second surface; forming an encapsulation layer, at least covering a side surface of the chip; and removing at least a part of the bonding layer, and forming a re-wiring structure, where the re-wiring structure leads out the pad.

8 Claims, 5 Drawing Sheets

(58) Field of Classification Search
CPC . H10W 74/019; H10W 70/042; H10W 74/15; H10W 74/012
See application file for complete search history.

(56) References Cited

U.S. PATENT DOCUMENTS

| | | | |
|---|---|---|---|
| 11,049,734 | B2 | 6/2021 | Chew |
| 2009/0039496 | A1 | 2/2009 | Beer et al. |
| 2011/0151625 | A1* | 6/2011 | Hoshino ............... H01L 21/568 |
| | | | 438/118 |
| 2011/0165734 | A1* | 7/2011 | Han .................... H01L 23/3128 |
| | | | 438/118 |
| 2011/0227220 | A1* | 9/2011 | Chen .................... H01L 21/568 |
| | | | 438/109 |
| 2017/0243763 | A1 | 8/2017 | Choi et al. |
| 2018/0151393 | A1* | 5/2018 | Chew .................... H01L 21/568 |
| 2019/0371626 | A2 | 12/2019 | Chew |

FOREIGN PATENT DOCUMENTS

| | | |
|---|---|---|
| CN | 102270589 A | 12/2011 |
| CN | 102709200 A | 10/2012 |
| CN | 105551988 A | 5/2016 |
| CN | 107104070 A | 8/2017 |
| CN | 108172551 A | 6/2018 |
| CN | 108231606 A | 6/2018 |
| CN | 111739804 A | 10/2020 |
| CN | 111952190 A | 11/2020 |
| CN | 113436979 A | 9/2021 |
| JP | 2001156121 A | 6/2001 |
| KR | 20140126137 A | 10/2014 |

OTHER PUBLICATIONS

ISA State Intellectual Property Office of the People's Republic of China, International Search Report Issued in Application No. PCT/CN2022/097360, Aug. 18, 2022, WIPO, 4 pages.

ISA State Intellectual Property Office of the People's Republic of China, Written Opinion of the International Searching Authority Issued in Application No. PCT/CN2022/097360, Aug. 18, 2022, WIPO, 6 pages. (Submitted with Machine/Partial Translation).

* cited by examiner

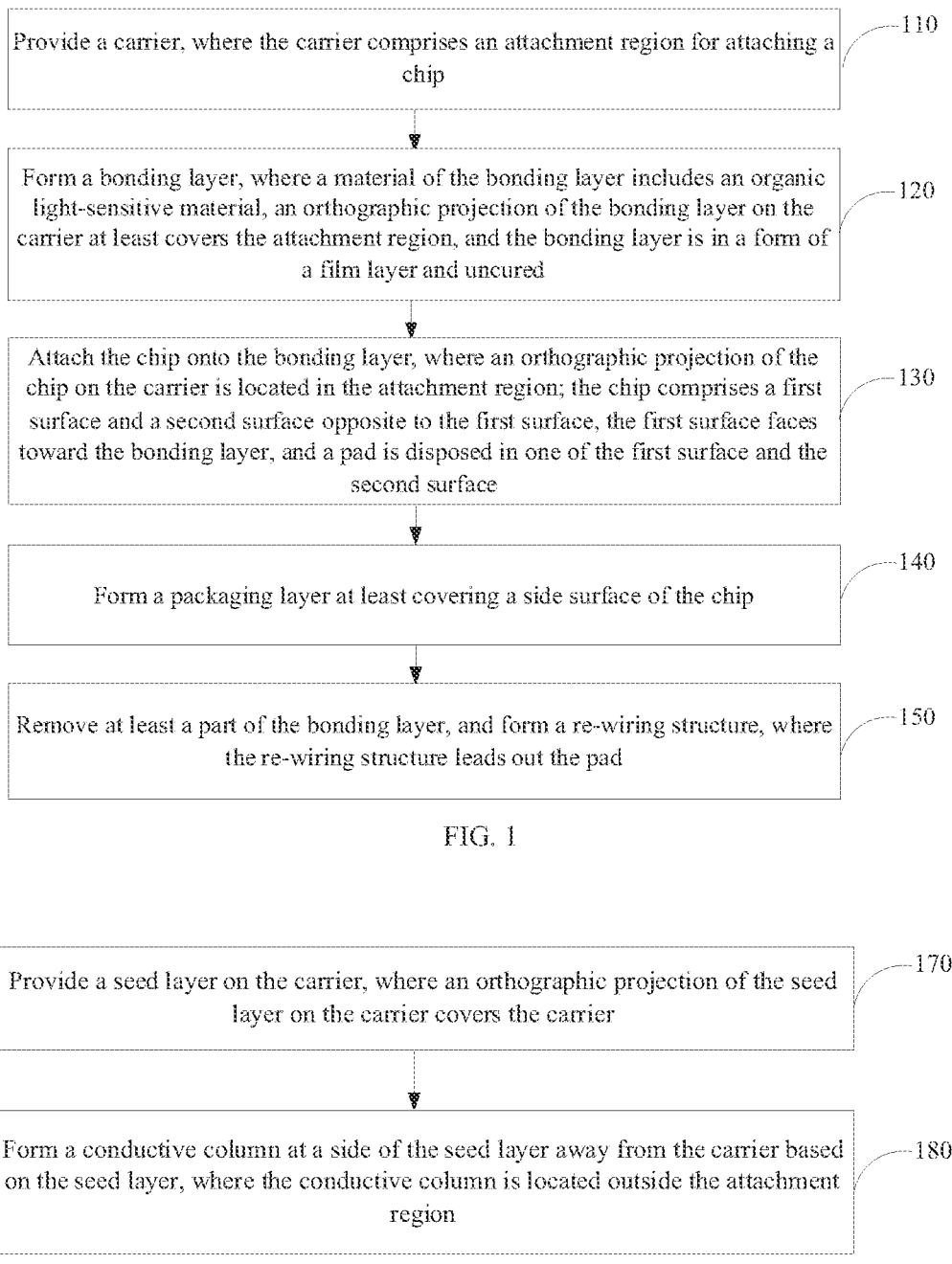

Provide a carrier, where the carrier comprises an attachment region for attaching a chip ⟋—110

Form a bonding layer, where a material of the bonding layer includes an organic light-sensitive material, an orthographic projection of the bonding layer on the carrier at least covers the attachment region, and the bonding layer is in a form of a film layer and uncured ⟋—120

Attach the chip onto the bonding layer, where an orthographic projection of the chip on the carrier is located in the attachment region; the chip comprises a first surface and a second surface opposite to the first surface, the first surface faces toward the bonding layer, and a pad is disposed in one of the first surface and the second surface ⟋—130

Form a packaging layer at least covering a side surface of the chip ⟋—140

Remove at least a part of the bonding layer, and form a re-wiring structure, where the re-wiring structure leads out the pad ⟋—150

FIG. 1

Provide a seed layer on the carrier, where an orthographic projection of the seed layer on the carrier covers the carrier ⟋—170

Form a conductive column at a side of the seed layer away from the carrier based on the seed layer, where the conductive column is located outside the attachment region ⟋—180

FIG. 2

SEMICONDUCTOR PACKAGING METHOD

CROSS REFERENCE TO RELATED APPLICATION

This application is a U.S. National Stage of International Application No. PCT/CN2022/097360, filed on Jun. 7, 2022. International Application No. PCT/CN2022/097360 claims priority to Chinese Application No. 202110661583.2, filed on Jun. 15, 2021. The entire contents of each of the above-listed applications are hereby incorporated by reference for all purposes.

TECHNICAL FIELD

The present disclosure relates to the field of semiconductor technologies and in particular to a semiconductor packaging method.

BACKGROUND

A conventional semiconductor packaging technology, for example, a chip packaging technology mainly includes the following process: firstly attaching a chip to a carrier, and forming an encapsulation layer by hot press and injection molding, and then removing the carrier, and finally forming a re-wiring layer leading out a pad of the chip.

In the chip packaging technology, when an encapsulation layer is formed, the chip may be moved, leading to poor electrical connection between the re-wiring layer subsequently formed and the pad of the chip, and hence to failure of the final packaging product.

SUMMARY

An embodiment of the present disclosure provides a semiconductor packaging method, including:

> providing a carrier, where the carrier comprises an attachment region for attaching a chip;
> forming a bonding layer, where a material of the bonding layer includes an organic photosensitive material, an orthographic projection of the bonding layer on the carrier at least covers the attachment region, and the bonding layer is in a form of a film layer and uncured;
> attaching the chip onto the bonding layer, where an orthographic projection of the chip on the carrier is located in the attachment region; the chip includes a first surface and a second surface opposite to the first surface, the first surface faces toward the bonding layer, and a pad is disposed in one of the first surface and the second surface;
> forming an encapsulation layer, at least covering a side surface of the chip; and
> removing at least a part of the bonding layer, and forming a re-wiring structure, wherein the re-wiring structure leads out the pad.

An embodiment of the present disclosure provides a semiconductor packaging structure, including:

> a chip, including a first surface and a second surface opposite to the first surface, where a pad is disposed on one of the first surface and the second surface;
> a bonding layer, provided around the chip to securely fix the chip;
> an encapsulation layer, at least covering a side surface of the chip; and
> a re-wiring structure, electrically coupled to the pad.

The details of one or more embodiments of the present disclosure will be proposed in the following drawings and descriptions. Other features, objects and advantages of the present disclosure will become apparent from the description, the drawings and the claims.

BRIEF DESCRIPTION OF THE DRAWINGS

FIG. 1 is a flowchart illustrating a semiconductor packaging method according to an exemplary embodiment of the present disclosure.

FIG. 2 is a flowchart illustrating a semiconductor packaging method according to another exemplary embodiment of the present disclosure.

DETAILED DESCRIPTION

Figure 3:
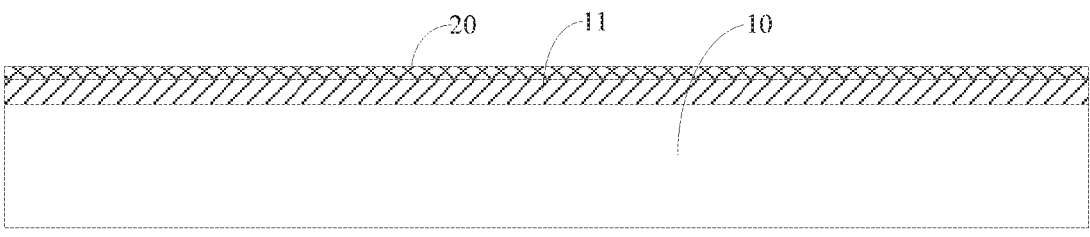
FIG. 3 is a structural schematic diagram illustrating a first intermediate structure of a semiconductor packaging structure according to an exemplary embodiment of the present disclosure.

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular examples only, and are not intended to limit the present disclosure. Terms determined by "a", "the" and "said" in their singular forms in the present disclosure and the appended claims are also intended to include plurality, unless clearly indicated otherwise in the context. It should also be understood that the term "and/or" as used herein refers to and includes any and all possible combinations of one or more of the associated listed items.

It is to be understood that, although the terms "first", "second", "third", and the like may be used in the present disclosure to describe various information, such information should not be limited to these terms. These terms are only used to distinguish one category of information from another. For example, without departing from the scope of the present disclosure, first information may be referred as second information; and similarly, the second information may also be referred as the first information. Depending on the context, the term "if" as used herein may be interpreted as "when" or "upon" or "in response to determining".

Some embodiments of the present disclosure will be detailed in combination with the drawings. In case of no conflicts, the embodiments below and the features in the embodiments can be mutually combined.

An embodiment of the present disclosure provides a semiconductor packaging method. By referring to FIG. 1, the semiconductor packaging method may include the following steps 110 to 150.

At step 110, a carrier is provided, where the carrier includes an attachment region for attaching a chip.

At step 120, a bonding layer is formed, wherein a material of the bonding layer includes an organic photosensitive material. An orthographic projection of the bonding layer on the carrier at least covers the attachment region, and the bonding layer is in a form of a film layer and uncured.

At step 130, the chip is attached to the bonding layer, where an orthographic projection of the chip on the carrier is located in the attachment region. The chip has a first surface and a second surface opposite to the first surface, the first surface faces toward the bonding layer and a pad is disposed on one of the first surface and the second surface.

At step 140, an encapsulation layer is formed, where the encapsulation layer at least covers a side surface of the chip.

At step 150, at least part of the bonding layer is removed and a re-wiring structure is formed, where the re-wiring structure leads out the pad.

In the semiconductor packaging method of the embodiments of the present disclosure, a bonding layer made of an organic photosensitive material is formed and a chip is attached to the bonding layer, and thus the chip can be fixed securely on a carrier. In this way, the problem that the chip is moved due to material flow of an encapsulation layer during formation of the encapsulation layer can be avoided, the electrical connection effect between the pad of the chip and the re-wiring structure can be guaranteed, and the yield of the products is improved. The bonding layer is in a form of a film layer and uncured, and hence, the bonding layer is more easily removed. Since the chip will not move easily after being attached through the bonding layer, under the precondition that the process error is given and the pad of the chip are covered by the re-wiring structure, a distance between the edge of the part of the re-wiring structure covering the pad of the chip and the edge of the pad of the chip is reduced, namely, a size of the part of the re-wiring structure covering the pad of the chip is set to small, such that the distance between adjacent wires of the re-wiring structure is increased, and the wiring difficulty of the re-wiring structure is reduced.

The semiconductor packaging method provided by the embodiment of the present disclosure will be detailed below.

In the step 110, a carrier is provided, where the carrier includes an attachment region for attaching a chip.

In an embodiment, a material of the carrier may be stainless steel, glass, ceramic, and a flame-resistant material with a rating of FR4 and the like. The shape of the carrier may be a circle or a rectangle or the like.

In an embodiment, a shape of the attachment region of the carrier may be designed based on the layout of the chip on the carrier. The shape of the attachment region may be a circle, a rectangle or the like. The carrier may include a plurality of attachment regions.

The carrier may also include a non-attachment region outside the attachment region. All regions beyond the attachment region on the carrier are the non-attachment region.

In the step 120, a bonding layer is formed, where a material of the bonding layer includes an organic photosensitive material. An orthographic projection of the bonding layer on the carrier at least covers the attachment region, and the bonding layer is in a form of a film layer and uncured.

In an embodiment, the photosensitive material may change in property after being irradiated by light, for example, the photosensitive material is cured after being irradiated by light. The material of the bonding layer may be a dielectric material, and the light may be ultraviolet light.

The photosensitive material is an organic material which has large viscosity and small flowability. Thus, the following problem can be avoided: due to a large flowability of the photosensitive material, the formed bonding layer can easily flow, and consequently, the orthographic projection of the bonding layer on the carrier cannot cover the attachment region after the bonding layer flows; and further, a chip attached in subsequent step cannot be securely fixed on carrier through the bonding layer.

In an embodiment, the material of the bonding layer includes at least one of polyimide (PI) or solder mask. As a result, the bonding layer has good viscosity, such that the chip can be well fixed on the carrier. During formation of the encapsulation layer, the chip will move less likely relative to the carrier.

In an embodiment, before the step 120 of forming the bonding layer is performed, the semiconductor packaging method further includes the following steps 170 and 180.

At step 170, a seed layer is provided on the carrier, where an orthographic projection of the seed layer on the carrier covers the carrier.

A first intermediate structure shown in FIG. 3 can be obtained in the step 170. As shown in FIG. 3, the orthographic projection of the seed layer 20 on the carrier 10 covers the carrier 10.

In an embodiment, an adhesive layer 11 is provided on the carrier 10 and the seed layer 20 is fixed on the carrier through the adhesive layer 11. The adhesive layer 11 can fix the seed layer 20 securely on the carrier 10 to prevent the seed layer 20 from separating from the carrier 10 or moving relative to the carrier 10.

In some embodiments, the adhesive layer 11 may be made from a peelable material, such that the seed layer 20 can be separated from the carrier 10 subsequently. For example, the adhesive layer 11 may be made from a pyrolytic or photolytic material or the like. In some embodiments, two surfaces of the adhesive layer 11 have different viscosities. The material of the adhesive layer can be selected based on the type of the carrier 10.

In an embodiment, the seed layer may be formed by a sputtering process. A material of the seed layer may be copper. In another embodiment, the seed layer may be a prefabricated metal layer, for example, the seed layer may be a copper foil.

In another embodiment, no adhesive layer may be provided on the carrier 10. The step 170 of providing the seed layer on the carrier may include the following process.

Firstly, a metal interface layer is formed on an auxiliary metal layer by an electroless plating process. The auxiliary metal layer has a thickness of 10 µm to 20 µm. The auxiliary metal layer may be a prefabricated double-faced copper foil.

Next, a seed layer is formed on the metal interface layer by an electroplating process.

Next, under high temperature and high pressure, the auxiliary metal layer, the metal interface layer and the seed layer are attached to the carrier while the auxiliary metal layer is in direct contact with the carrier.

In an embodiment, the seed layer has a thickness of 3 µm to 15 µm. In some embodiments, the thickness of the seed layer may be, for example, 3 µm, 5 µm, 7 µm, 9 µm, 11 µm, 13 µm, 15 µm or the like.

At step 180, a conductive column located on a side of the seed layer away from the carrier is formed based on the seed layer, where the conductive column is located outside the attachment region.

The bonding layer formed in the step 120 is located on a side of the seed layer 20 away from the carrier 10.

In an embodiment, the step 180 of forming the conductive column located on a side of the seed layer away from the carrier based on the seed layer may include the following process.

Firstly, a patterned insulation layer is provided on a side of the seed layer away from the carrier, where the insulation layer is hollowed.

A material of the insulation layer may be a photoresist material. The process of forming the insulation layer is as follows: firstly forming a photoresist material layer and then forming a hollow by exposure development process. A position of the hollow of the insulation layer is a position for forming the conductive column.

Next, the seed layer is coupled to a power source for electroplating, such that conductive column is formed in a region of the seed layer exposed by the hollow.

Next, the insulation layer is removed.

Figure 4:
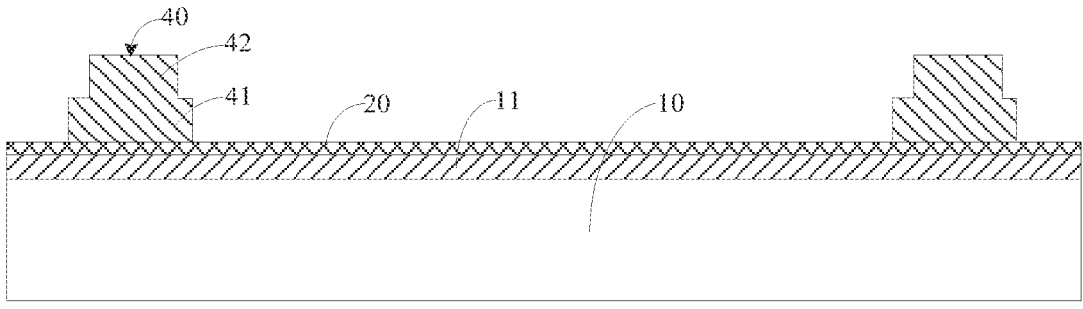
FIG. 4 is a structural schematic diagram illustrating a second intermediate structure of a semiconductor packaging structure according to an exemplary embodiment of the present disclosure.

After the insulation layer is removed, a second intermediate structure shown in FIG. 4 can be obtained. As shown in FIG. 4, the conductive column 40 is plural in number, and a plurality of conductive column 40 are spaced apart and disposed around each attachment region.

During an electroplating process, a metal is deposited in a region of the seed layer exposed by the hollow of the insulation layer, and after electroplating, the deposited metal is the conductive column. Compared with the solution in which an entire surface of metal layer is formed by electroplating without a photoresist layer and then etched to form the conductive column, the disposal of the photoresist layer can save electroplating material cost and reduce process complexity.

In some solutions, a prefabricated lead frame is used in a semiconductor packaging process. When the lead frame includes conductive column, the conductive column of the lead frame has a large diameter due to limitation of accuracy of the preparation process (usually the diameter of the conductive column is greater than 200 µm), and thus is not applicable to the packaging products with a small spacing between the pad of the chip. Further, the lead frame usually has a thickness of about 300 µm, and the lead frame may deform during formation of the encapsulation layer, leading to poor electrical connection between a re-wiring structure formed subsequently and the conductive column or to inability of the re-wiring structure to fully cover a surface of the conductive column facing toward the re-wiring structure, and hence to failure of the product.

In this embodiment, the conductive column is formed by an electroplating process and a size of the hollow of the insulation layer is equal to a size of a cross section of the conductive column. Thus, an external size of the conductive column can be controlled by using the size of the hollow of the insulation layer, for example, the external size of the conductive column can be set to small. Therefore, in the semiconductor packaging method provided by the embodiments of the present disclosure, compared with the solution in which the conductive column is prefabricated, the external size of the conductive column can be set to small and thus can be applied to the products with a small spacing between the pad of the chip. Furthermore, during formation of the conductive column, the thickness of the conductive column can be controlled to avoid deformation of the conductive column during formation of the encapsulation layer. In this way, reliable electrical connection between the conductive column and the re-wiring structure formed subsequently can be guaranteed, and the yield of the products is improved.

In some embodiments, the material of the conductive column 40 may be a metal copper.

In an embodiment, the thickness of the conductive column 40 is greater than 200 µm. The conductive column 40 includes a first conductive portion 41 located on the seed layer 20 and a second conductive portion 42 located on a side of the first conductive portion 41 away from the seed layer 20. An edge of an orthographic projection of the second conductive portion 42 on the carrier 10 is located within an edge of an orthographic projection of the first conductive portion 41 on the carrier 10.

When the thickness of the conductive column 40 is greater than 200 µm, the conductive column 40 are usually formed through two electroplating processes. By controlling the size of the hollow of the insulation layer in the electroplating process, the above structure of the conductive column 40 can be implemented. When the conductive column 40 is formed as the above structure, the material of the encapsulation layer, during formation of the encapsulation layer in a subsequent step, may be more favorable for draining the air between the encapsulation layer and the conductive column 40, such that a gap between the formed encapsulation layer and the conductive column 40 is avoided, and the packaging effect of the encapsulation layer for the conductive column 40 is improved.

In some embodiments, a distance between the edge of the orthographic projection of the second conductive portion 42 on the carrier 10 and the edge of the orthographic projection of the first conductive portion 41 on the carrier 10 may be constant. In some other embodiments, the distance between the edge of the orthographic projection of the second conductive portion 42 on the carrier 10 and the edge of the orthographic projection of the first conductive portion 41 on the carrier 10 may be variable.

In an embodiment, the distance between the edge of the orthographic projection of the second conductive portion 42 on the carrier 10 and the edge of the orthographic projection of the first conductive portion 41 on the carrier 10 is less than or equal to 8 μm. In this case, it can ensure that the distance is within the accuracy realized by the process and avoid that the distance between the edge of the orthographic projection of the second conductive portion 42 on the carrier 10 and the edge of the orthographic projection of the first conductive portion 41 on the carrier 10 is excessively large and thus that the area of the cross section of the first conductive portion 41 is relatively large. When a given number of conductive columns are disposed around the chip, a distance between adjacent conductive columns 40 will be too small, and further, the wiring space of the re-wiring structure formed subsequently is limited, and the wiring difficulty is increased.

Figure 5:
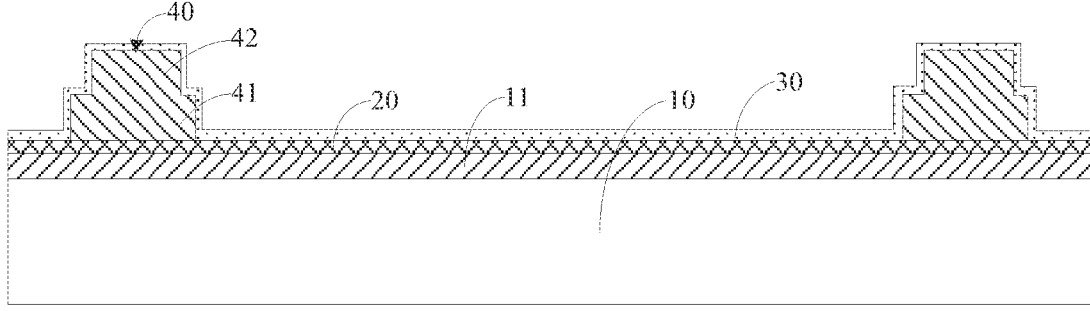
FIG. 5 is a structural schematic diagram illustrating a third intermediate structure of a semiconductor packaging structure according to an exemplary embodiment of the present disclosure.

In an embodiment, an orthographic projection of the bonding layer on the carrier covers the carrier. A third intermediate structure shown in FIG. 5 can be obtained by the step 120. As shown in FIG. 5, the top and the sides of the conductive column 40 are all covered by the bonding layer 30. When the orthographic projection of the bonding layer on the carrier covers the carrier, compared with the solution in which only a partial region is covered by the bonding layer, the bonding layer can be formed without mask, thus the difficulty of the preparation of the bonding layer is reduced.

In an embodiment, the thickness of the bonding layer 30 is 3 μm to 15 μm. In this case, the following problem can be avoided: due to small thickness and small viscosity of the bonding layer 30, the chip cannot be securely attached to the carrier when attached to the bonding layer 30 subsequently. Further, the following problem can be avoided: due to large thickness of the bonding layer 30, when the chip is attached to the bonding layer 30, a pressure applied to the chip squeezes out the material of the bonding layer from the edge of the chip, and hence a protrusion structure is formed around the chip, as a result, formation of the encapsulation layer in subsequent step is affected.

In some exemplary embodiments, the thickness of the bonding layer 30 may be, for example, 3 μm, 6 μm, 9 μm, 12 μm, 15 μm or the like.

In an embodiment, the step 120 of forming the bonding layer may include: forming the bonding layer by electrostatic coating process. During an electrostatic coating process, the material of the bonding layer is energized and atomized and the atomized molecules are moved toward the seed layer 20 under the action of the electric field and adsorbed to the seed layer 20. By using the electrostatic coating process, the thickness of the bonding layer can be effectively controlled, and the thickness of the formed bonding layer is made relatively uniform, such that the flatness of the surface of the product is improved.

At step 130, the chip is attached to the bonding layer, where an orthographic projection of the chip on the carrier is located in the attachment region. The chip has a first surface and a second surface opposite to the first surface, the first surface faces toward the bonding layer and a pad are disposed in one of the first surface and the second surface.

In this step, a pressure may be applied to the chip such that the chip can be securely attached to the bonding layer.

In some embodiments, when the orthographic projection of the bonding layer on the substrate 10 covers the substrate, after the chip is attached to the bonding layer, the first surface of the chip may be flush with a surface, away from the carrier, of the bonding layer around the chip, or lower than the surface, away from the carrier, of the bonding layer around the chip. This is determined by the pressure applied to the chip.

Figure 6:
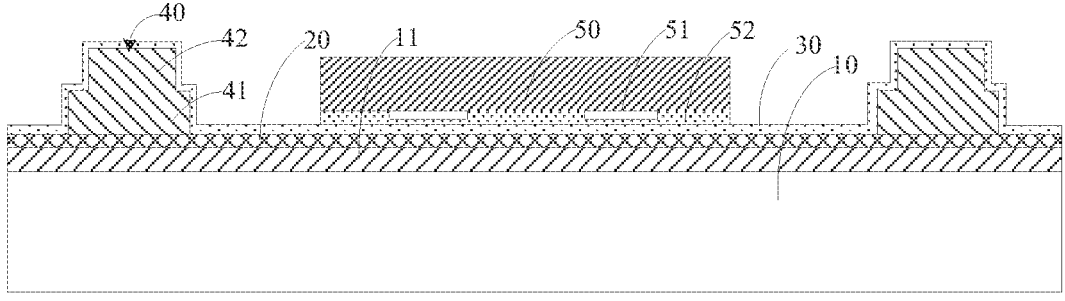
FIG. 6 is a structural schematic diagram illustrating a fourth intermediate structure of a semiconductor packaging structure according to an exemplary embodiment of the present disclosure.

A fourth intermediate structure shown in FIG. 6 can be obtained in the step 130. The chip includes opposed front surface and back surface, and the pad of the chip is disposed on the front surface of the chip. In the embodiment shown in FIG. 6, the front surface of the chip 50 where the pad 51 is disposed face toward the bonding layer, namely, the front surface of the chip 50 is the first surface. In other embodiments, the back surface of the chip 50 may face toward the bonding layer.

In an embodiment, the front surface of the chip 50 is provided with a protective layer 52. The protective layer 52 may cover the edge of the pad 51. The protective layer 52 may have a thickness greater than that of the pad 51. The protective layer 52 covers the pad 51.

In an embodiment, the orthographic projection of the bonding layer on the carrier covers at least a part of the non-attachment region. After the step 130 of attaching the chip to the bonding layer is performed, before the step 140 of forming the encapsulation layer is performed, the semiconductor packaging method further includes the following step:

The bonding layer is irradiated by light, such that a part of the bonding layer with the orthographic projection on the carrier located outside the attachment region is cured. A part of the bonding layer opposed to the chip is not irradiated by light and hence not cured.

Removing at least a part of the bonding layer includes: removing a part of the bonding layer opposed to the chip.

When the bonding layer is irradiated by light, because a part of the bonding layer between the chip and the seed layer is blocked by the chip, the light cannot be incident to this part of the bonding layer, and thus this part of the bonding layer will not be cured. Since a part of the bonding layer with the orthographic projection on the carrier located outside the attachment region is not blocked, the light can be directly incident to this part of the bonding layer, such that this part of the bonding layer with the orthographic projection on the carrier located outside the attachment region is cured.

By irradiating the bonding layer with light, the bonding layer with the orthographic projection on the carrier located outside the attachment region is cured. When the encapsulation layer is formed subsequently, the adhesiveness between the encapsulation layer and the cured bonding layer is improved. Before the re-wiring structure is formed, the part of the bonding layer opposed to the chip is removed, such that the adhesiveness between the re-wiring structure subsequently formed and the chip can be improved.

In an embodiment, the bonding layer in the non-attachment region surrounds the chip, and an orthographic projection of the bonding layer in the non-attachment region on the carrier adjoins an orthographic projection of the chip on the carrier. In this case, after the bonding layer in the non-attachment region is fixed, the chip can be locked fixedly to prevent movement of the chip during subsequent formation of the encapsulation layer. In this way, the electrical connection effect between the pad of the chip and the re-wiring structure formed subsequently can be guaranteed, and the yield of the products is improved.

Furthermore, each position of the edge of the orthographic projection of the chip on the carrier adjoins orthographic projection of the bonding layer in the non-attachment region on the carrier. In this case, after the bonding layer in the non-attachment region is fixed, better fixing effect can be achieved for the chip.

In an embodiment, the orthographic projection of the bonding layer on the carrier can cover the carrier. Alternatively, the orthographic projection of the bonding layer on the carrier can cover a part of the carrier.

At step 140, an encapsulation layer is formed, where the encapsulation layer at least covers a side surface of the chip.

In an embodiment, when conductive column is formed before the step 140, the encapsulation layer further covers the side surface of the conductive column.

Figure 7:
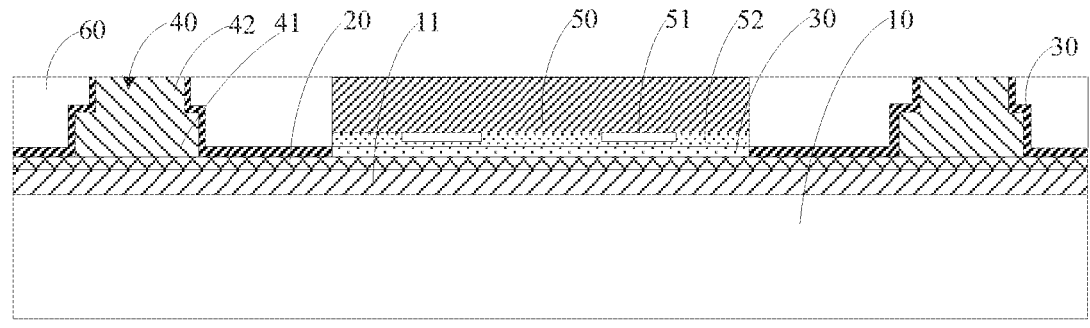
FIG. 7 is a structural schematic diagram illustrating a fifth intermediate structure of a semiconductor packaging structure according to an exemplary embodiment of the present disclosure.

A fifth intermediate structure shown in FIG. 7 can be obtained in the step 140. As shown in FIG. 7, the encapsulation layer 60 covers the side surface of the conductive column 40, and the second surface of the chip 50 and the surface of the conductive column 40 away from the carrier are exposed respectively out of the surface of the encapsulation layer away from the carrier 10. In some embodiments, when the second surface of the chip 50 is the back surface of the chip, the second surface of the chip 50 may not be exposed out of the encapsulation layer 60; when the second surface of the chip 50 is the front surface of the chip, the second surface of the chip 50 is to be exposed out of the encapsulation layer 60.

In an embodiment, the encapsulation layer 60 may be formed by laminating an epoxy resin film, or formed by performing injection molding or press molding or the like on an epoxy resin compound.

Figure 8:
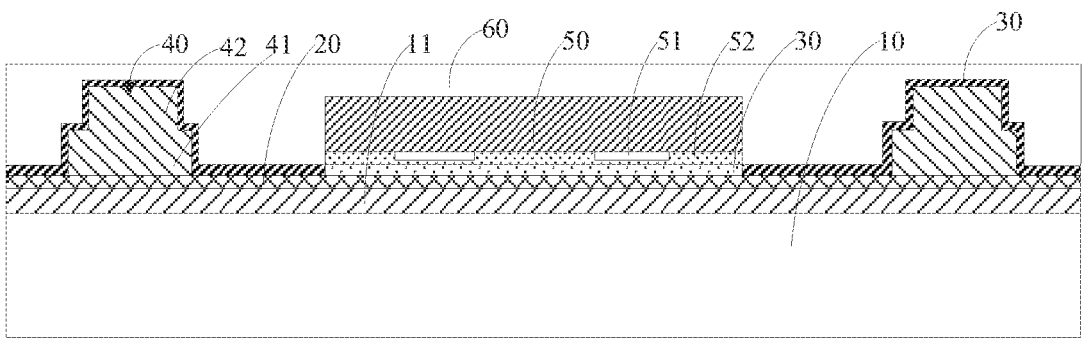
FIG. 8 is a structural schematic diagram illustrating the fifth intermediate structure before thinning an encapsulation layer according to an exemplary embodiment of the present disclosure.

In an embodiment, referring to FIG. 8, a distance from the surface, away from the carrier 10, of the encapsulation layer 60 originally formed to the carrier 10 may be greater than a distance from the surface of the conductive column 40 away from the carrier 10 to the carrier 10. By performing thinning processing on the encapsulation layer, the surface of the conductive column 40 away from the carrier 10 is flushed with the surface of the encapsulation layer 60 away from the carrier 10, so as to expose the surface, away from the carrier, of the conductive column 40 out of the encapsulation layer 60. In some embodiments, the thinning process can be performed on the encapsulation layer 60 by grinding or by dry plasma etching process.

At step 150, at least a part of the bonding layer is removed and a re-wiring structure is formed, where the re-wiring structure leads out the pad.

Figure 9:
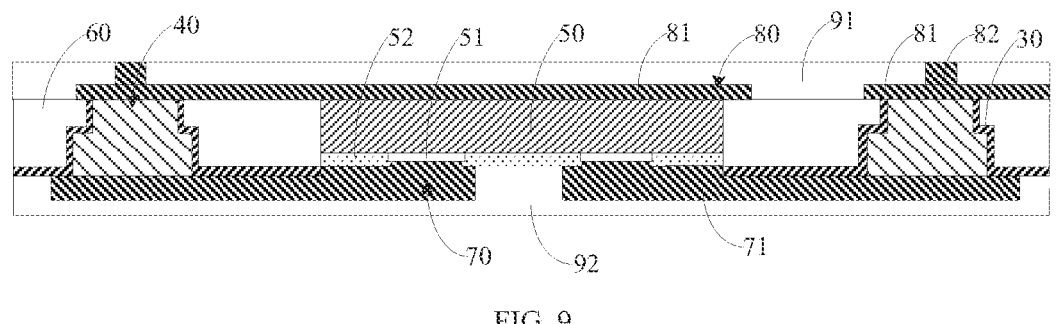
FIG. 9 is a structural schematic diagram illustrating a semiconductor packaging structure according to an exemplary embodiment of the present disclosure.

The semiconductor packaging structure shown in FIG. 9 can be obtained in the step 150.

As shown in FIG. 9, the re-wiring structure includes a first wiring sub-structure 70 and a second wiring sub-structure 80. The re-wiring structure can be formed as the following.

The first wiring sub-structure is formed on a side of the encapsulation layer away from the second surface, and the second wiring sub-structure is formed on a side of the encapsulation layer away from the first surface. The wiring sub-structure close to the front surface of the chip in the first wiring sub-structure, and the second wiring sub-structure is electrically coupled with the pad. The first wiring sub-structure is electrically coupled with the second wiring sub-structure through the conductive column.

In an embodiment, the bonding layer covers the surface of the conductive column away from the seed layer. Removing at least a part of the bonding layer includes: before forming the second wiring sub-structure, removing the cured bonding layer on a side of the conductive column away from the seed layer. By removing the cured bonding layer on a side of the conductive column away from the seed layer, the surface of the conductive column away from the carrier can be exposed, so as to ensure electrical connection between the conductive column and the second wiring sub-structure.

In some embodiments, the cured bonding layer on a side of the conductive column away from the seed layer can be removed while thinning is performed on the encapsulation layer. In this way, the preparation process can be simplified.

In an embodiment, removing at least a part of the bonding layer may further include the following steps.

Firstly, before the first wiring sub-structure is formed, the carrier is removed to expose the seed layer.

In an embodiment, the seed layer is fixed on the carrier through an adhesive layer. When the adhesive layer is made from a pyrolytic or photolytic material, the adhesive layer may be heated or irradiated by light to remove its viscosity, so as to facilitate the separation of the carrier and the seed layer.

In another embodiment, no adhesive layer is disposed on the carrier. When the auxiliary metal layer, the metal interface layer and the seed layer are attached to the carrier under high temperature and high pressure, the carrier is removed mechanically from the encapsulation layer. Since a bonding force between the auxiliary metal layer and the carrier and a bonding force between the metal interface layer and the auxiliary metal layer both are large, when the carrier is removed from the encapsulation layer, the auxiliary metal layer and the metal interface layer will be separated from the encapsulation layer together with the carrier.

Next, the seed layer is etched to expose the part of the bonding layer opposed to the chip.

Next, the part of the bonding layer opposed to the chip is removed.

The part of the bonding layer opposed to the chip refers to a part of the bonding layer opposed to the chip along a stacking direction of the film layer.

Thus, the part of the bonding layer opposed to the chip can be removed to ensure good adhesiveness between the first wiring sub-structure and the chip; further, when the first surface of the chip is the front surface provided with the pad, it is ensured that the pad of the chip is electrically coupled to the first wiring sub-structure.

In some embodiments, the part of the bonding layer opposed to the chip can be removed by development process.

In an embodiment, the first wiring sub-structure may be firstly formed and then the second wiring sub-structure is formed. In another embodiment, the second wiring sub-structure may be firstly formed and then the first wiring sub-structure is formed. With an example in which the second wiring sub-structure is firstly formed and then the first wiring sub-structure is formed and the front surface of the chip are provided with the pad, the formation process of the re-wiring structure is described below.

Firstly, the second wiring sub-structure is formed on a side of the encapsulation layer away from the first surface.

Figure 10:
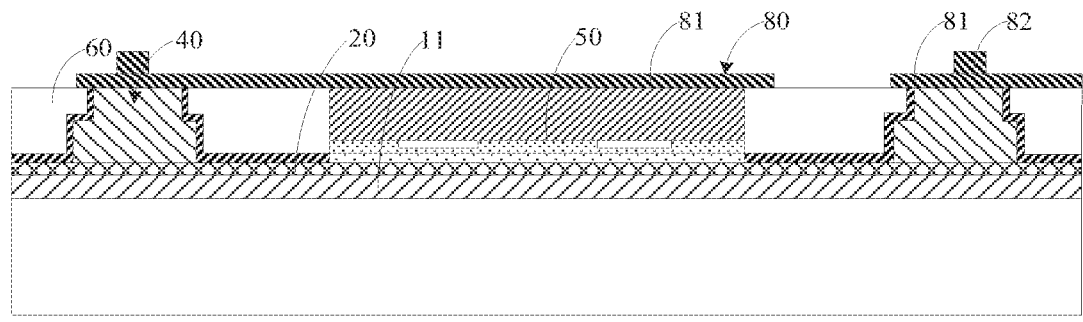
FIG. 10 is a structural schematic diagram illustrating a sixth intermediate structure of a semiconductor packaging structure according to an exemplary embodiment of the present disclosure.

A sixth intermediate structure shown in FIG. 10 can be obtained in the step. As shown in FIG. 10, the second wiring sub-structure 80 is in contact with the surface of the conductive column 40 away from the first surface of the chip 50.

When the first surface of the chip 50 is provided with the pad, the second wiring sub-structure 80 includes a second re-wiring layer 81 and a conductive protrusion 82 on a side of the second re-wiring layer 81 away from the chip 50. The semiconductor packaging structure is coupled with an external structure through the conductive protrusions 82.

In some embodiments, the second wiring sub-structure may be formed in the following process: firstly, a seed layer is formed, then a patterned photoresist layer is formed, and then electroplating is performed and then the photoresist layer is removed.

Next, a first dielectric layer covering the second re-wiring layer is formed, and a surface of the conductive protrusions away from the second re-wiring layer is exposed out of the first dielectric layer.

Figure 11:
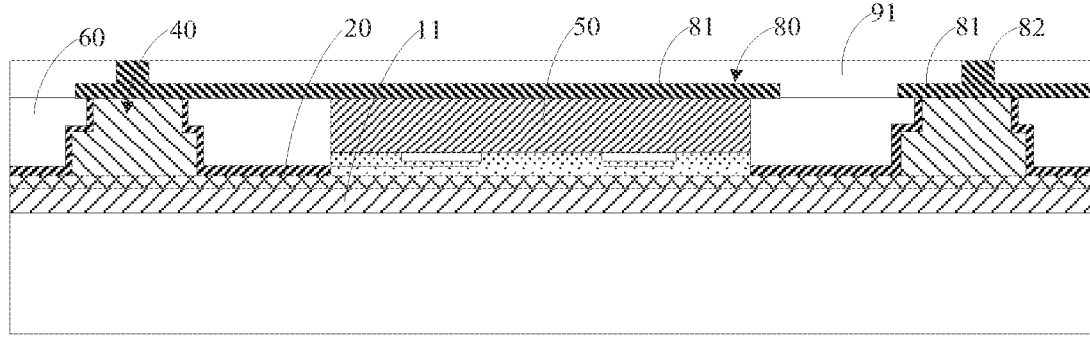
FIG. 11 is a structural schematic diagram illustrating a seventh intermediate structure of a semiconductor packaging structure according to an exemplary embodiment of the present disclosure.

A seventh intermediate structure shown in FIG. 11 can be obtained in this step.

The first dielectric layer 91 can protect the second re-wiring layer 81 and the conductive protrusions 82, and thus the structure surface after obtaining the second wiring sub-structure can be made flat.

Next, the carrier is removed to expose the seed layer.

Next, the seed layer is etched to expose the part of the bonding layer opposed to the chip.

Figure 12:
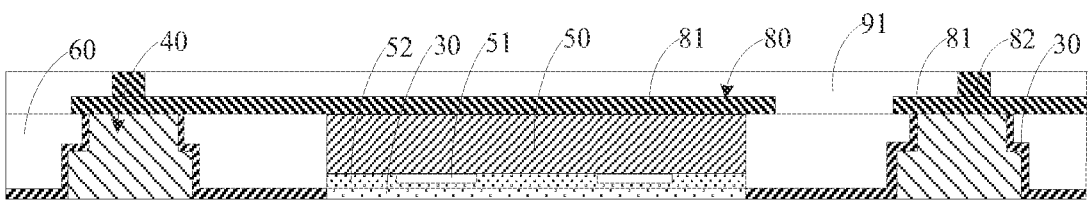
FIG. 12 is a structural schematic diagram illustrating an eighth intermediate structure of a semiconductor packaging structure according to an exemplary embodiment of the present disclosure.

In this step, the seed layer can be all removed. An eighth intermediate structure shown in FIG. 12 can be obtained in this step. The part of the bonding layer 30 opposed to chip 50 is the uncured part of the bonding layer.

Next, the part of the bonding layer opposed to the chip is removed.

Figure 13:
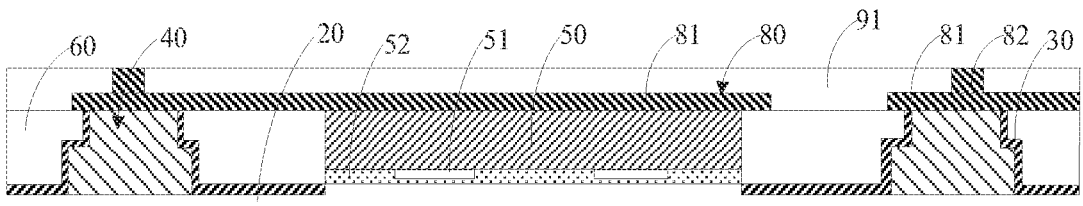
FIG. 13 is a structural schematic diagram illustrating a ninth intermediate structure of a semiconductor packaging structure according to an exemplary embodiment of the present disclosure.

A ninth intermediate structure shown in FIG. 13 can be obtained in this step. As shown in FIG. 13, the protective layer 52 of the chip 50 is exposed.

In an embodiment, the part of the bonding layer opposed to the chip can be removed by development process.

In an embodiment, the first surface is provided with the pad. After the part of the bonding layer opposed to the chip is removed, the semiconductor packaging method further includes:

forming openings for exposing the pad in the protective layer.

Figure 14:
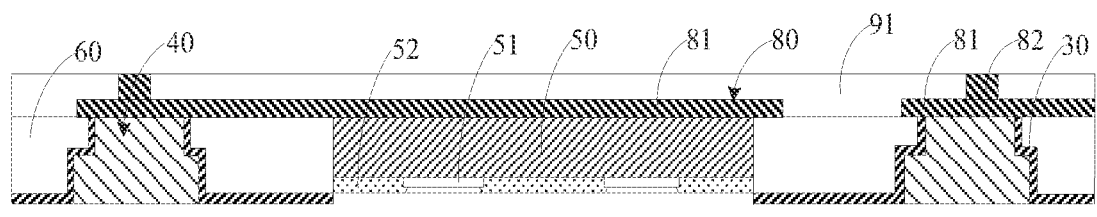
FIG. 14 is a structural schematic diagram illustrating a tenth intermediate structure of a semiconductor packaging structure according to an exemplary embodiment of the present disclosure.

A tenth intermediate structure shown in FIG. 14 can be obtained in this step. As shown in FIG. 14, the openings of the protective layer 52 expose the pad 51.

Next, the first wiring sub-structure is formed on a side of the encapsulation layer away from the second surface, where the first wiring sub-structure is electrically coupled to the pad of the chip.

Figure 15:
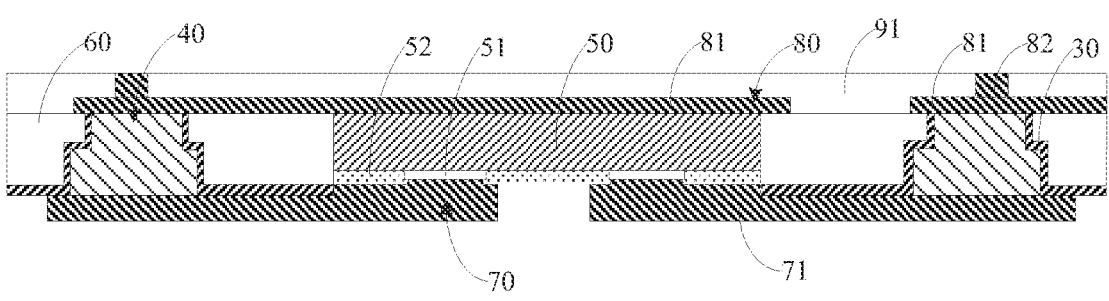
FIG. 15 is a structural schematic diagram illustrating an eleventh intermediate structure of a semiconductor packaging structure according to an exemplary embodiment of the present disclosure.

An eleventh intermediate structure shown in FIG. 15 can be obtained in this step. As shown in FIG. 15, the first wiring sub-structure is electrically coupled to the pad of the chip.

In some embodiments, the first wiring sub-structure can be formed in the following process: firstly, a seed layer is formed, then a patterned photoresist layer is formed, and then electroplating is performed and then the photoresist layer is removed.

With reference to FIG. 15, the first wiring sub-structure 70 includes a first re-wiring layer 71, where the surface of the first re-wiring layer 71 away from the chip is not exposed out of a second dielectric layer 92.

Next, the second dielectric layer is formed to cover the first wiring sub-structure.

The semiconductor packaging structure shown in FIG. 9 can be obtained in this step. As shown in FIG. 9, the surface of the first re-wiring layer 71 away from the chip is not exposed out of the second dielectric layer 92. Thus, the second dielectric layer 92 can protect the first re-wiring layer 71.

In an embodiment, the semiconductor packaging method further includes: cutting the semiconductor packaging structure into a plurality of sub-packaging structures, where each of the sub-packaging structures includes one or more chips.

It is to be noted that the drawings provided by the embodiments of the present disclosure are only illustrative and may have some differences from the actual structure.

For example, the drawings do not show the pad on the front surface of the chip, and actually, the pad on the front surface of the chip are electrically coupled to the re-wiring structure.

It should be noted that in the accompanying drawings, for illustration clarity, the sizes of the layers and regions may be exaggerated. Furthermore, it may be understood that when an element or layer is referred to as being "on" another element or layer, such element or layer may be directly on another element or layer or there is an intermediate layer therebetween. Further, it is understood that when an element or layer is referred to as being "under" another element or layer, such element or layer may be directly under another element or layer, or one or more intermediate elements or layers are present therebetween. In addition, it may also be understood that when a layer or element is referred to as being between two layers or elements, such layer or element may be a sole layer between the two layers or elements, or one or more intermediate layers or elements are present. Like reference signs in the descriptions indicate like elements.

Other implementations of the present disclosure will be apparent to those skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and examples are considered as exemplary only, with a true scope and spirit of the present disclosure being indicated by the following claims.

It is to be understood that the present disclosure is not limited to the precise structure described above and shown in the accompanying drawings, and that various modifications and changes may be made without departing from the scope thereof. The scope of the present disclosure is limited only by the appended claims.

The invention claimed is:

1. A semiconductor packaging method, comprising:

providing a carrier, wherein the carrier comprises an attachment region for attaching a chip and a non-attachment region located outside the attachment region;

providing a seed layer on the carrier, wherein an orthographic projection of the seed layer on the carrier covers the carrier;

forming a conductive column on a side of the seed layer away from the carrier based on the seed layer, wherein the conductive column is located outside the attachment region;

forming a bonding layer, wherein a material of the bonding layer comprises an organic photosensitive material, an orthographic projection of the bonding layer on the carrier at least covers the attachment region, and the bonding layer is in a form of a film layer and uncured; and wherein the bonding layer is located on a side of the seed layer away from the carrier; the orthographic projection of the bonding layer on the carrier covers at least a part of the non-attachment region; and the bonding layer located in the non-attachment region covers a surface of the conductive column away from the seed layer, the bonding layer located in the non-attachment region surrounds the chip, and the orthographic projection of the bonding layer in the non-attachment region on the carrier adjoins the orthographic projection of the chip on the carrier;

attaching the chip onto the bonding layer, wherein an orthographic projection of the chip on the carrier is located in the attachment region; the chip comprises a first surface and a second surface opposite to the first surface, the first surface faces toward the bonding layer, and a pad is disposed on one of the first surface and the second surface;

irradiating the bonding layer by light, such that a part of the bonding layer with the orthographic projection on the carrier located outside the attachment region is cured;

forming an encapsulation layer, at least covering a side surface of the chip;

removing the cured bonding layer on a side of the conductive column away from the seed layer;

forming a first wiring sub-structure on a side of the encapsulation layer away from the second surface; and forming a second wiring sub-structure on a side of the encapsulation layer away from the first surface;

wherein one of the first wiring sub-structure and the second wiring sub-structure close to a front surface of the chip is electrically coupled with the pad, and the first wiring sub-structure is electrically coupled with the second wiring sub-structure through the conductive column.

2. The semiconductor packaging method of claim 1, wherein removing at least a part of the bonding layer comprises, before forming the first wiring sub-structure:

removing the carrier to expose the seed layer;

etching the seed layer to expose a part of the bonding layer opposed to the chip; and removing the part of the bonding layer opposed to the chip.

3. The semiconductor packaging method of claim 2, wherein the first surface is provided with the pad and the chip is further provided with a protective layer covering the pad;

the semiconductor packaging method further comprises, after removing the part of the bonding layer opposed to the chip:

forming openings for exposing the pad on the protective layer.

4. The semiconductor packaging method of claim 1, wherein a thickness of the conductive column is greater than 200 μm, the conductive column comprises a first conductive portion located on the seed layer and a second conductive portion located on a side of the first conductive portion away from the seed layer, and an edge of an orthographic projection of the second conductive portion on the carrier is located inside an edge of an orthographic projection of the first conductive portion on the carrier.

5. The semiconductor packaging method of claim 4, wherein a distance between the edge of the orthographic projection of the second conductive portion on the carrier and the edge of the orthographic projection of the first conductive portion on the carrier is less than or equal to 8 μm.

6. The semiconductor packaging method of claim 4, wherein a distance between the edge of the orthographic projection of the second conductive portion on the carrier and the edge of the orthographic projection of the first conductive portion on the carrier is constant.

7. The semiconductor packaging method of claim 1, wherein forming the conductive column located on a side of the seed layer away from the carrier based on the seed layer comprises:

providing a patterned insulation layer on a side of the seed layer away from the carrier, wherein the patterned insulation layer is provided a hollow;

coupling the seed layer to a power source for electroplating to form the conductive column in a region of the seed layer exposed by the hollow; and removing the patterned insulation layer.

8. The semiconductor packaging method of claim 1, wherein the bonding layer has a thickness of 3 μm to 15 μm; or/and, a material of the bonding layer comprises at least one of solder mask or polyimide.

* * * * *